United States Patent
Chung et al.

(10) Patent No.: US 9,503,052 B1
(45) Date of Patent: Nov. 22, 2016

(54) FREQUENCY SELECTIVE CIRCUIT

(71) Applicant: MEDIATEK INC., Hsin-Chu (TW)

(72) Inventors: Yuan-Hung Chung, Zhubei (TW); Ming-Yeh Hsu, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/821,885

(22) Filed: Aug. 10, 2015

Related U.S. Application Data (60) Provisional application No. 62/153,622, filed on Apr. 28, 2015.

(51) Int. Cl.
*H03K 5/00* (2006.01)
*H03H 11/04* (2006.01)

(52) U.S. Cl.
CPC ...... *H03H 11/0461* (2013.01); *H03H 11/0405* (2013.01); *H03H 11/0416* (2013.01); *H03H 11/0466* (2013.01); *H03H 2011/0411* (2013.01)

(58) Field of Classification Search
CPC .................. H03H 1/02; H03H 7/0107; H03H 7/0115; H03H 7/0123; H03H 11/1291
USPC .................. 327/552–559, 336–337
See application file for complete search history.

(56) References Cited

U.S. PATENT DOCUMENTS

| | | | |
|---|---|---|---|
| 7,218,170 B1 | 5/2007 | Carter et al. | |
| 7,345,547 B2 * | 3/2008 | Wang | H03F 1/30 330/285 |
| 7,902,917 B2 * | 3/2011 | Mirzaei | H03H 1/02 327/344 |
| 8,502,597 B2 * | 8/2013 | Khatibi | H03H 11/1213 327/552 |
| 2011/0090824 A1 | 4/2011 | Khatibi et al. | |
| 2012/0098574 A1 | 4/2012 | Morikawa | |

OTHER PUBLICATIONS

Greenberg, et al.: "A 40MHz-to-1GHz Fully Integrated Multistandard Silicon Tuner in 80nm CMOS"; IEEE International Solid-State Circuits Conference; Copyright 2012; pp. 1-31.
EP Search Report dated Jul. 19, 2016 in EP application (No. 15190380A-1805).
Sanchez-Sinencio, et al: "CMOS transconductance amplifiers, architectures and active filters: a tutorial"; IEEE Proc.-Circuits Devices Sys., vol. 147, No. 1, Feb. 2000; pp. 3-12.
Ramirez-Angulo, et al: "Compact implementation of high-performance CMOS current mirror"; Electronics Letters, 12 May 2005; vol. 21; No. 10; pp. 1-2.
Z. Wang: "Current-Mode Lowpass Filters in CMOS Technology"; Microelectronics Journal, 23 (1992) 479-481.

* cited by examiner

*Primary Examiner* — Dinh T Le
(74) *Attorney, Agent, or Firm* — McClure, Qualey & Rodack, LLP (57) ABSTRACT

A frequency selective circuit includes a first transistor, an impedance element, a first capacitive element, a second capacitive element, a second capacitive and a second transistor. The first transistor includes a first terminal, a second terminal and a control terminal. The impedance element is coupled between the first terminal and the control terminal of the first transistor. The first capacitive element is coupled to the first terminal of the first transistor. The second capacitive element is coupled to the control terminal of the first transistor. The second transistor includes a first terminal, a second terminal and a control terminal, wherein the control terminal of the second transistor is coupled to the control terminal of the first transistor.

14 Claims, 7 Drawing Sheets

FREQUENCY SELECTIVE CIRCUIT

This application claims the benefit of U.S. provisional Ser. No. 62/153,622, filed Apr. 28, 2015, the disclosure of which is incorporated by reference herein in its entirety.

TECHNICAL FIELD

The disclosure relates in general to a frequency selective circuit.

BACKGROUND

In modern circuit designs, the frequency selective circuit, such as the low pass filter (LPF), is an indispensable block for filtering signals. For example, an inphase/quadrature modulator (IQM) may cooperate with a simple LPF cascaded by passive RC (resistor, capacitor) filters to generate signals to be transmitted. Once the frequency of unwanted signal is close to the desired signal, such LPF cannot provide enough rejections because of the low Q.

For getting better rejections, the designer needs to cascade more stages of RC filters, which occupied larger area, generates lager output noise and may corrupt the desired signal.

Therefore, there is a need of a frequency selective circuit capable of performing high Q filtering and reducing the output noise.

SUMMARY

The disclosure is directed to a frequency selective circuit capable of performing high Q filtering and reducing the output noise.

According to one embodiment, a frequency selective circuit is provided. The frequency selective circuit includes a first transistor, an impedance element, a first capacitive element, a second capacitive element, a second capacitive and a second transistor. The first transistor includes a first terminal, a second terminal and a control terminal. The impedance element is coupled between the first terminal and the control terminal of the first transistor. The first capacitive element is coupled to the first terminal of the first transistor. The second capacitive element is coupled to the control terminal of the first transistor. The second transistor includes a first terminal, a second terminal and a control terminal, wherein the control terminal of the second transistor is coupled to the control terminal of the first transistor.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
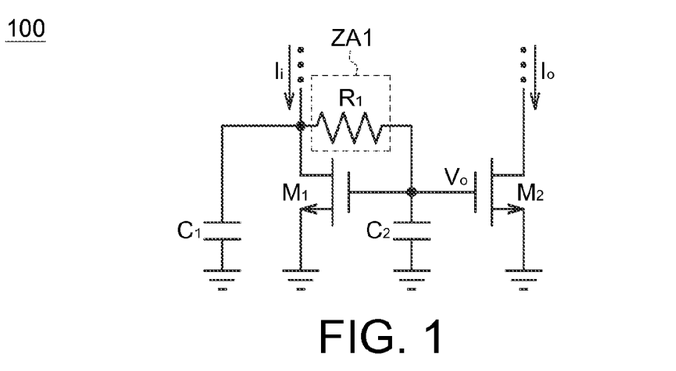
FIG. 1 shows the circuit diagram of a frequency selective circuit according to an embodiment of the present invention.

FIG. 1 shows the circuit diagram of a frequency selective circuit 100 according to an embodiment of the present invention. The frequency selective circuit 100 includes a first transistor $M_1$, an impedance element ZA1, a first capacitive element $C_1$, a second capacitive element $C_2$ and a second transistor $M_2$. The impedance element ZA1 includes a resistive element such as the resistor $R_1$. The impedance element ZA1 is coupled between the drain and gate of the first transistor $M_1$. The first capacitive element $C_1$ is coupled to the drain of the first transistor $M_1$. The gate of the first transistor $M_1$ is coupled to the second capacitive element $C_2$ and the gate of the second transistor $M_2$. The first and second capacitive elements $C_1$ and $C_2$ can be implemented by capacitors for example.

The drain of the first transistor $M_1$ is further coupled to the input current $I_i$, and thus a control voltage $V_o$ is induced on the gate of the second transistor $M_2$. In response to the control voltage $V_o$, the second transistor $M_2$ generates the output current $I_o$ at its drain.

The transfer function of the frequency selective circuit 100 can be expressed as follows:

$$H(s) = \frac{g_{m2}}{g_{m1}} \times \frac{1}{1 + \frac{C_1 + C_2}{g_{m1}}s + \frac{R_1 C_1 C_2}{g_{m1}}s^2} \quad (eq1)$$

wherein H(s) represents the transfer function from the input current $I_i$ to the output current $I_o$, $g_{m1}$ and $g_{m2}$ represent the transconductances of the first and second transistors $M_1$ and $M_2$, respectively, $C_1$ and $C_2$ represent the capacitances of the first and second capacitive elements $C_1$ and $C_2$, respectively, and $R_1$ represents the resistance of the resistor $R_1$. According to equation eq1, the frequency selective circuit 100 can be regarded as a $2^{nd}$ order current-mode filter. By appropriately selecting the values of the parameters shown in equation eq1, the Q-factor can be larger than 0.5. That is, the frequency selective circuit 100 is capable of perform a high Q filtering. Further, it can be obtained from FIG. 1 that, an additional cascode stage is unnecessary for the frequency selective circuit 100, and hence the voltage headroom can be enlarged.

Figure 2:
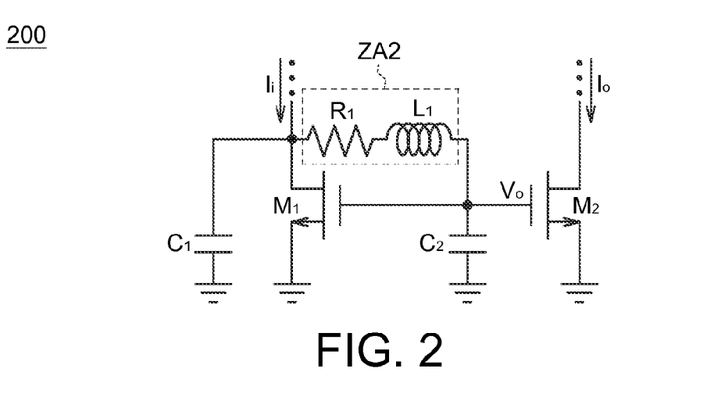
FIG. 2 shows the circuit diagram of a frequency selective circuit according to an alternative embodiment of the present invention.

In some embodiments, the impedance element coupled to the first transistor may include at least one of a resistive element (e.g., a resistor) and an inductive element (e.g., an inductor). FIG. 2 shows the circuit diagram of a frequency selective circuit 200 according to an alternative embodiment of the present invention. For illustration purposes, denotations in FIG. 2 that are same as those in FIG. 1 represent elements, materials or substances that are functionally identical or similar, and associated details are omitted herein. However, the above is not to be construed as a limitation to the present invention. In other embodiments, elements with the same denotations may be implemented by different circuits, materials or structures.

In FIG. 2, the impedance element ZA2 includes a resistor $R_1$ and an inductor $L_1$ in series. The transfer function of the frequency selective circuit 200 can be expressed as follows:

$$H(s) = \frac{g_{m2}}{g_{m1}} \times \frac{1}{1 + \frac{C_1 + C_2}{g_{m1}}s + \frac{(R_1 + sL_1)C_1 C_2}{g_{m1}}s^2} \quad (eq2)$$

wherein $L_1$ represents the inductance of the inductor $L_1$. As can be seen from equation eq2, the inductor $L_1$ provides one more pole at frequency $\omega_{PL}=R_1/L_1$. Thus, the out-band rejections of the frequency selective circuit 200 can be further improved by appropriately choosing the pole frequency $\omega_{PL}$.

Figure 3:
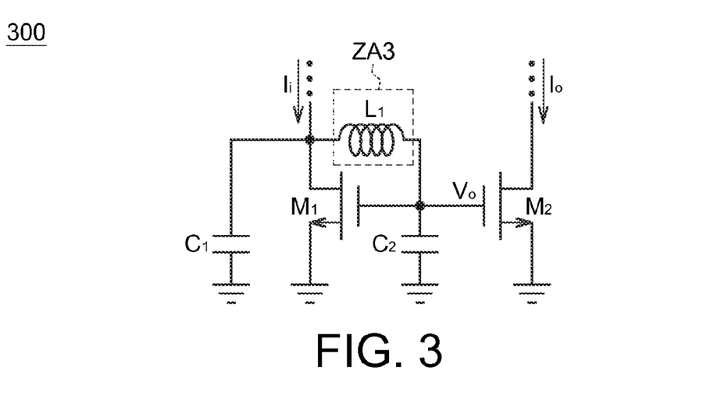
FIG. 3 shows the circuit diagram of a frequency selective circuit according to an alternative embodiment of the present invention.

FIG. 3 shows the circuit diagram of a frequency selective circuit 300 according to an alternative embodiment of the present invention. The main difference between the frequency selective circuit 300 and the frequency selective circuit 200 shown in FIG. 2 is that the impedance element ZA3 includes inductor(s) $L_1$ only.

In some embodiments, the frequency selective circuit may cascade multiple sub-circuits to perform high-order filtering.

Figure 4:
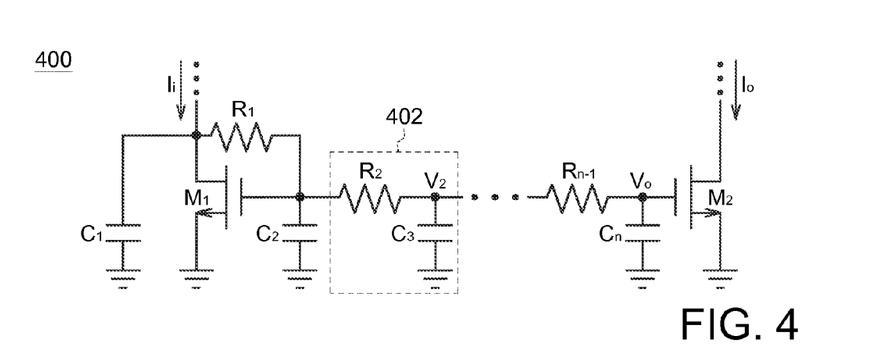
FIG. 4 shows the circuit diagram of a frequency selective circuit according to an alternative embodiment of the present invention.

FIG. 4 shows the circuit diagram of a frequency selective circuit 400 according to an alternative embodiment of the present invention. The frequency selective circuit 400 includes multiple sub-circuits 402 cascaded between the gates of the first and second transistors $M_1$ and $M_2$. The sub-circuits 402 can be implemented by various types of filters. For example, in FIG. 4, each sub-circuit 402 includes a RC filter.

The simplified transfer function of the frequency selective circuit 400 can be expressed as follows:

$$H(s) = \frac{g_{m2}}{g_{m1}} \times \frac{1}{1 + \frac{C_1 + C_2}{g_{m1}}s + \frac{R_1 C_1 C_2}{g_{m1}}s^2} \times \quad (eq3)$$
$$\frac{1}{1 + R_2 C_3 s} \times \ldots \times \frac{1}{1 + R_{n-1} C_n s}$$

wherein $C_3$ to $C_n$ respectively represent the capacitances of the capacitors $C_3$ to $C_n$, and $R_2$ to $R_{n-1}$ respectively represent the resistances of the resistors $R_2$ to $R_{n-1}$.

Figure 5:
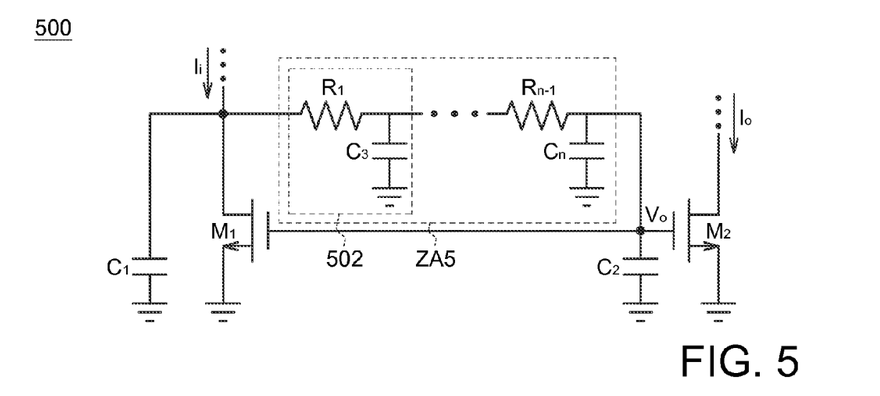
FIG. 5 shows the circuit diagram of a frequency selective circuit according to an alternative embodiment of the present invention.

FIG. 5 shows the circuit diagram of a frequency selective circuit 500 according to an alternative embodiment of the present invention. The frequency selective circuit 500 employs the multiple sub-circuits 502 in its impedance element ZA5. As shown in FIG. 5, the impedance element ZA5 includes multiple sub-circuits 502 cascaded in series. Similar to the sub-circuits 402 shown in FIG. 4, each sub-circuit 502 can be formed by a RC filter, but it is understood that the present is not limited thereto.

The simplified transfer function of the frequency selective circuit 500 can be expressed as follows:

$$H(s) = \frac{g_{m2}}{g_{m1}} \times \frac{1}{1 + \left(\frac{C_1 + C_2}{g_{m1}}s + \frac{R_1 C_1 C_2}{g_{m1}}s^2\right) \times} \quad (eq4)$$
$$(1 + R_2 C_3 s) \times \ldots \times (1 + R_{n-1} C_n s)$$

Figure 6:
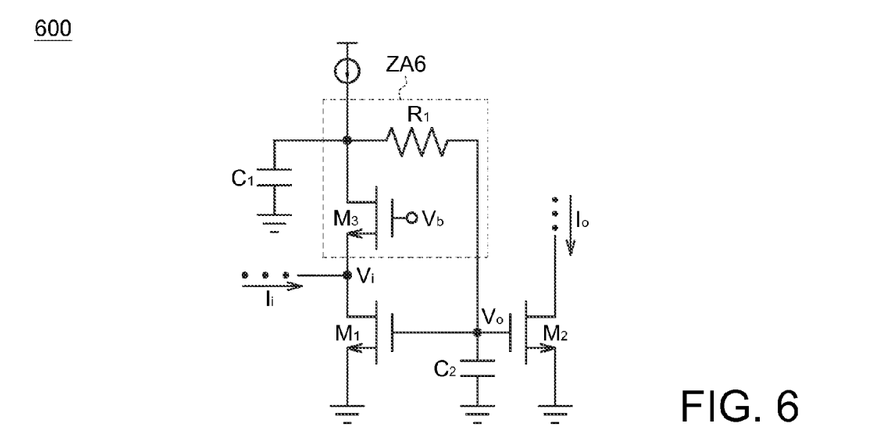
FIG. 6 shows the circuit diagram of a frequency selective circuit according to an alternative embodiment of the present invention.

FIG. 6 shows the circuit diagram of a frequency selective circuit 600 according to an alternative embodiment of the present invention. The impedance element ZA6 of the frequency selective circuit 600 further includes a third transistor $M_3$ for a low input swing design. As shown in FIG. 6, the drain of the third transistor $M_3$ is coupled to the gate of the first transistor $M_1$ via the resistor $R_1$. The source of the third transistor $M_3$ is coupled to the drain of the first transistor $M_1$. The gate of the third transistor $M_3$ is biased by a reference voltage $V_b$.

The transfer function of the frequency selective circuit 600 can be expressed as follows:

$$H(s) = \frac{g_{m2}}{g_{m1}} \times \frac{1}{1 + \frac{C_1 + C_2}{g_{m1}}s + \frac{R_1 C_1 C_2}{g_{m1}}s^2} \quad (eq5)$$

Compared to equation eq1, it can be obtained that the transfer function of the frequency selective circuit 600 remains the same. However, since the input swing can be determined by the transconductance of the third transistor $M_3$, without affecting the designed frequency response, the third transistor $M_3$ actually provides an extra degree of circuit design freedom, such that the low input swing design can be achieved.

Figure 7:
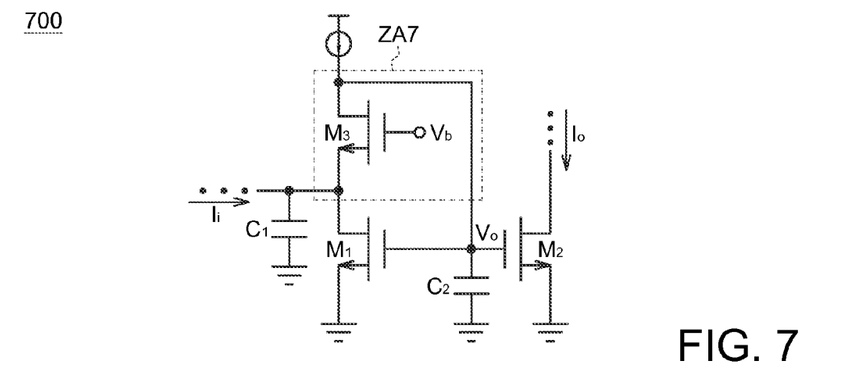
FIG. 7 shows the circuit diagram of a frequency selective circuit according to an alternative embodiment of the present invention.

FIG. 7 shows the circuit diagram of a frequency selective circuit 700 according to an alternative embodiment of the present invention. The main difference between the frequency selective circuit 700 and the frequency selective circuit 600 shown in FIG. 6 is that the resistor $R_1$ is removed from the impedance element ZA7.

The transfer function of the frequency selective circuit 700 can be expressed as follows:

$$H(s) = \frac{g_{m2}}{g_{m1}} \times \frac{1}{1 + \frac{C_1}{g_{m1}}s + \frac{C_1 C_2}{g_{m1} g_{m3}}s^2} \quad (eq6)$$

wherein $g_{m3}$ represents the transconductance of the third transistor $M_3$. Compared to the previous embodiments, the frequency selective circuit 700 has more design freedom since the first and second capacitive elements $C_1$ and $C_2$ are isolated by the third transistor $M_3$. Once the third transistor is biased at the linear region, the transfer function returns to eq1.

Figure 8:
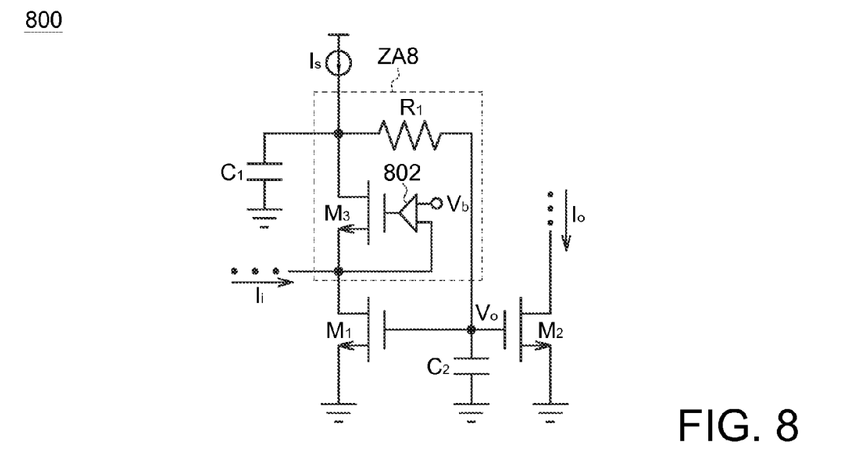
FIG. 8 shows the circuit diagram of a frequency selective circuit according to an alternative embodiment of the present invention.

FIG. 8 shows the circuit diagram of a frequency selective circuit 800 according to an alternative embodiment of the present invention. Compared to the frequency selective circuit 600 shown in FIG. 6, the impedance element ZA8 of the frequency selective circuit 800 further includes an operational amplifier 802 to reduce the input swing. The operational amplifier 802 includes a first input, a second input and an output. The first input is coupled to the reference voltage $V_b$, the second input is coupled to the source of the third transistor $M_3$, and the output is coupled to the gate of the third transistor $M_3$.

Due to the virtual short between the first and second inputs of the operational amplifier 802, the voltage at the node (i.e., source of the third transistor $M_3$, or drain of the first transistor $M_1$) coupling to the input current $I_i$ is fixed and the input swing can be set to zero.

Figure 9:
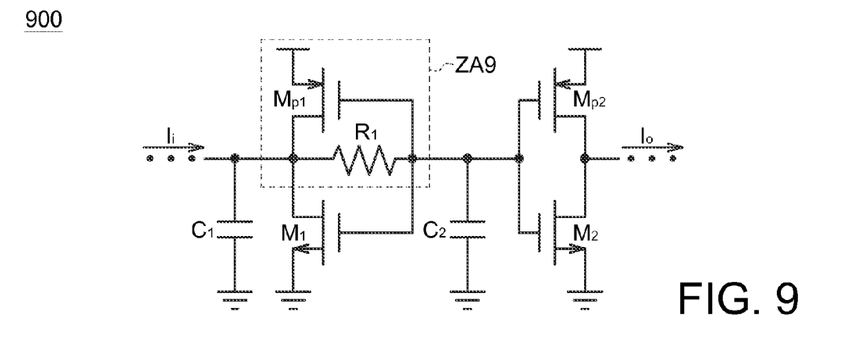
FIG. 9 shows the circuit diagram of a frequency selective circuit according to an alternative embodiment of the present invention.

FIG. 9 shows the circuit diagram of a frequency selective circuit 900 according to an alternative embodiment of the present invention. The frequency selective circuit 900 employs CMOS inverter configuration at its input stage and output stage. For the input stage, the impedance element ZA9 of the frequency selective circuit 900 includes a first complementary transistor $M_{p1}$. The type of the first complementary transistor $M_{p1}$ is complementary to that of the first transistor $M_1$. For example, the first complementary transistor $M_{p1}$ is a P-type transistor when the first transistor $M_1$ is an N-type transistor, while is an N-type transistor when the first transistor $M_1$ is a P-type transistor. The first complementary transistor $M_{p1}$ and the first transistor $M_1$ are connected to each other based CMOS inverter configuration, wherein the drain of the first complementary transistor $M_{p1}$ is coupled to the drain of the first transistor $M_1$, and the gate of the first complementary transistor $M_{p1}$ is coupled to the gate and of the first transistor $M_1$. Similarly, for the output stage, the frequency selective circuit 900 includes a second complementary transistor $M_{p2}$ coupled to the second transistor $M_2$ and forming a CMOS inverter together with the second transistor $M_2$.

The impedance element ZA9 further includes a resistive element, e.g., the resistor $R_1$, coupled between the drain and gate of the first complementary transistor $M_{P1}$. The transfer function of the frequency selective circuit 900 can be expressed as follows:

$$H(s) = \frac{g_{M2}}{g_{M1}} \times \frac{1}{1 + \frac{C_1 + C_2}{g_{M1}}s + \frac{R_1 C_1 C_2}{g_{M1}}s^2} \quad (eq7)$$

wherein $g_{M1}$ is the equivalent transconductance of the transconductances of the first complementary transistor $M_{p1}$ and the first transistor $M_1$, and $g_{M2}$ is the equivalent transconductance of the transconductances of the second complementary transistor $M_{p2}$ and the second transistor $M_2$. Compared to the previous embodiments, the equivalent transconductances $g_{M1}$ and $g_{M2}$ are twice with the same current consumption.

Figure 10:
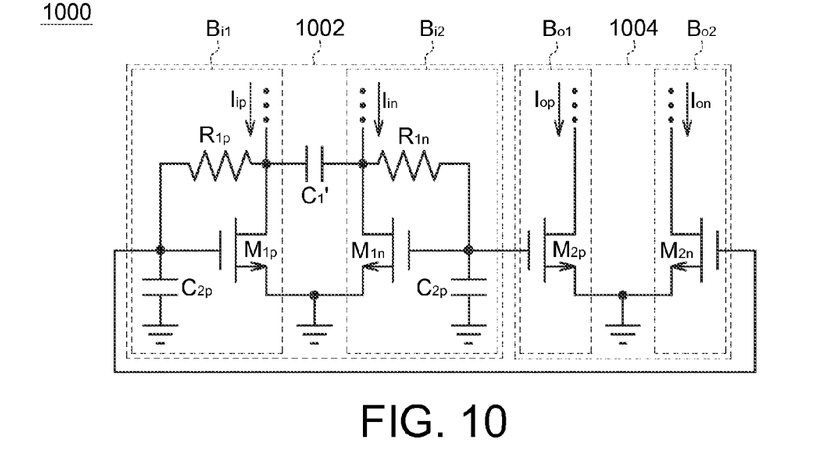
FIG. 10 shows the circuit diagram of a frequency selective circuit 1000 according to an alternative embodiment of the present invention.

FIG. 10 shows the circuit diagram of a frequency selective circuit 1000 according to an alternative embodiment of the present invention. The frequency selective circuit 1000 employs differential configuration at its input and output stages. As shown in FIG. 10, the frequency selective circuit 1000 includes an input differential pair 1002 at the input stage and an output differential pair 1004 at the output stage. The output differential pair 1004 may generate output currents $I_{op}$ and $I_{on}$ in response to the input currents $I_{ip}$ and received from the input differential pair 1002.

The input differential pair 1002 includes two branches $B_{i1}$ and $B_{i2}$. The branch $B_{i1}$ includes a transistor $M_{1p}$, a resistor $R_{1P}$ and a capacitor $C_{2p}$. The drain of the transistor $M_{1p}$ is coupled to its gate via the resistor $R_{1P}$, and the gate of the transistor $M_{1p}$ is further coupled to the capacitor $C_{2p}$. Similarly, the branch $B_{i2}$ includes a transistor $M_{1n}$, a resistor $R_{1n}$ and a capacitor $C_{2n}$. The drain of the transistor $M_{1n}$ is coupled to its gate via the resistor $R_{1n}$, and the gate of the transistor $M_{1n}$ is further coupled to the capacitor $C_{2n}$. A capacitor $C_1'$ is coupled between the drains of the transistors $M_{1p}$ and $M_{1n}$.

The input differential pair 1002 can be regarded as a differential form of the left part of the frequency selective circuit 100 shown in FIG. 1. That is, the first transistor $M_1$, the impedance element ZA1 and the second capacitive element $C_2$ can be used to form one branch $B_{i1}/B_{i2}$ of the input differential pair 1002, and the branch $B_{i1}/B_{i2}$ is coupled to the paired branch $B_{i2}/B_{i1}$ via the first capacitive element $C_1$.

The output differential pair 1004 includes two branches $B_{o1}$ and $B_{o2}$. The branch $B_{o1}$ includes a transistor $M_{2p}$ to induce the output current $I_{op}$, and the branch $B_{o2}$ includes a transistor $M_{2n}$ to induce the output current $I_{on}$. Also, the output differential pair 1004 can be regarded as the differential form of the right part of the frequency selective circuit 100. In other words, the second transistor $M_2$ can be used to form one branch $B_{o1}/B_{o2}$ of the output differential pair 1004, and the branch $B_{o1}/B_{o2}$ is coupled to the paired branch $B_{o2}/B_{o1}$ via the source of the second transistor $M_2$.

The transfer function of the frequency selective circuit 1000 has the same form as that of the frequency selective circuit 100 shown in FIG. 1, but the capacitance of the capacitor $C_1'$ can be half of $C_1$.

Figure 11:
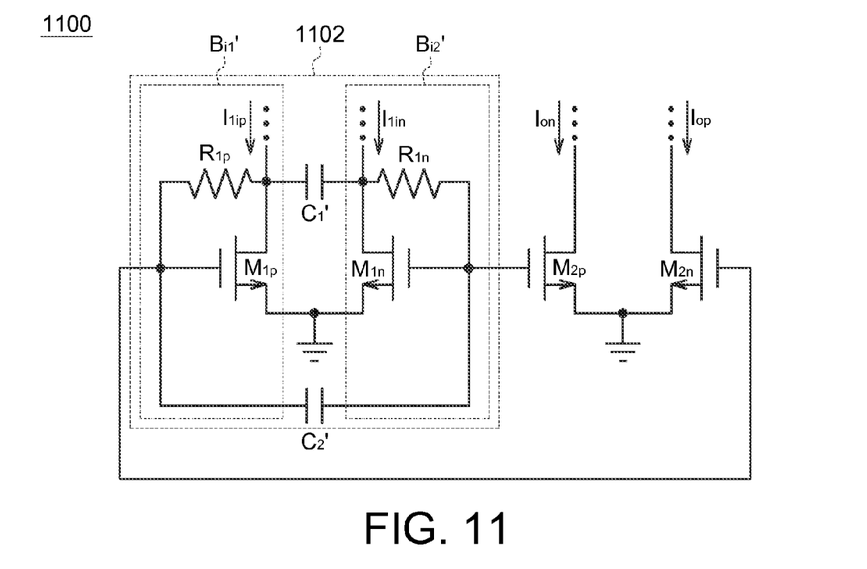
FIG. 11 shows the circuit diagram of a frequency selective circuit according to an alternative embodiment of the present invention.

FIG. 11 shows the circuit diagram of a frequency selective circuit 1100 according to an alternative embodiment of the present invention. In this embodiment, two branches $B_{i1}'$ and $B_{i2}'$ of the input differential pair 1102 are coupled to each other further via a capacitor $C_2'$. As shown in FIG. 11, the gate of the transistor $M_{1p}$ is coupled to the gate of the transistor of $M_{1n}$ via the capacitor $C_2'$. The transfer function of the frequency selective circuit 1100 has the same form as equation eq1, and the capacitance of the capacitor $C_2'$ can be half of the capacitance of the capacitor $C_2$.

Figure 12A:
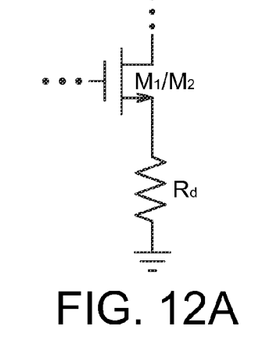
FIGS. 12A to 12C illustrate different source degeneration types according to embodiments of the present invention.
Figure 12B:
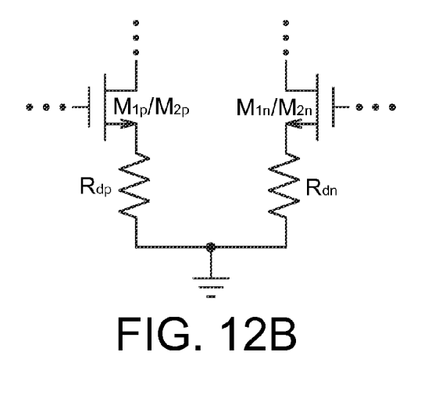
Figure 12C:
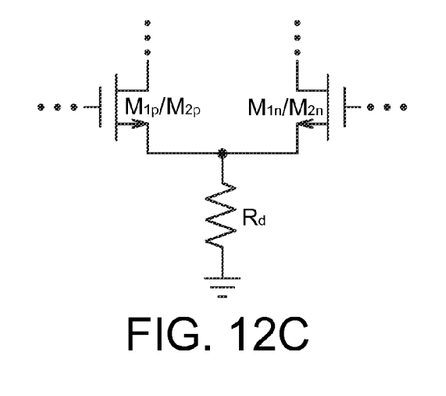

In some embodiments, the source degeneration technique can be used to improve the linearity of the circuit. As shown in FIG. 12A, the source of the first/second transistor $M_1/M_2$ is coupled to a degeneration resistive element $R_d$. For a differential pair, two degeneration resistive elements $R_{dp}$ and $R_{dn}$ can be added to the sources of the transistors $M_{1P}/M_{2P}$ and $M_{1n}/M_{2n}$, respectively, as shown in FIG. 12B. Alternatively, the sources of the transistors $M_{1P}/M_{2P}$ and $M_{1n}/M_{2n}$ can be commonly coupled to the same degeneration resistive element $R_d$, as shown in FIG. 12C.

Figure 13:
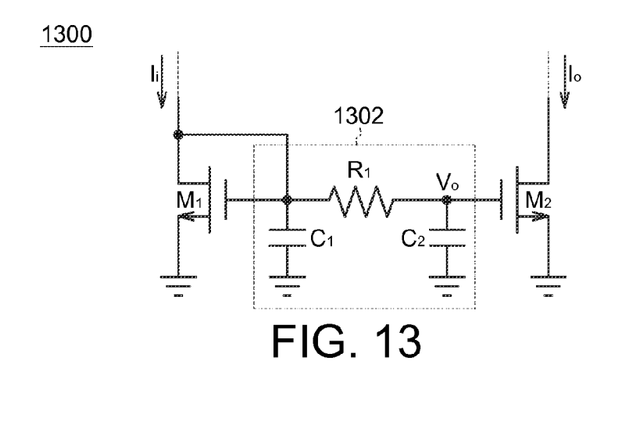
FIG. 13 illustrates the circuit diagram of a frequency selective circuit that the first transistor is diode-connected and a $2^{nd}$ order LPF is coupled between the gates of the first and second transistors.

FIG. 13 illustrates the circuit diagram of a frequency selective circuit 1300 that the first transistor M1 is diode-connected and a $2^{nd}$ order LPF 1302 is coupled between the gates of the first and second transistors $M_1$ and $M_2$. The transfer function of the frequency selective circuit 1300 can be expressed as follows:

$$H(s) = \frac{g_{m2}}{g_{m1}} \times \frac{1}{1 + \frac{C_1 + C_2 + g_{m1}R_1C_2}{g_{m1}}s + \frac{R_1C_1C_2}{g_{m1}}s^2} \quad (eq8)$$

If the term $g_{m1}R_1 \gg 1$, equation eq8 can be simplified to $$H(s) = \frac{g_{m2}}{g_{m1}} \times \frac{1}{\left(1 + \frac{1}{g_{m1}}C_1 s\right)(1 + R_1 C_2 s)} \quad (eq9)$$

From equation eq9, it can be derived that the Q-factor is smaller than 0.5, which could not provide large rejection. In addition, for the frequency selective circuit 1300, the output noise induced by the resistor $R_1$ is $$I_o = H(s) \times (g_{m1} + sC_1) \times \sqrt{4k'R_1} \quad (eq10)$$

wherein k' is a constant associated to temperature.

For comparison, it can be derived that the output noise induced by the resistor $R_1$ of the frequency selective circuit 100 is expressed as follows:

$$I_o = H(s) \times sC_1 \times \sqrt{4k'R_1} \quad (eq11)$$

It can be found that the in-band output noise of the frequency selective circuit 100 is much smaller than that of the frequency selective circuit 1300, which proves that the proposed frequency selective circuit has better noise reduction performance.

Figure 14A:
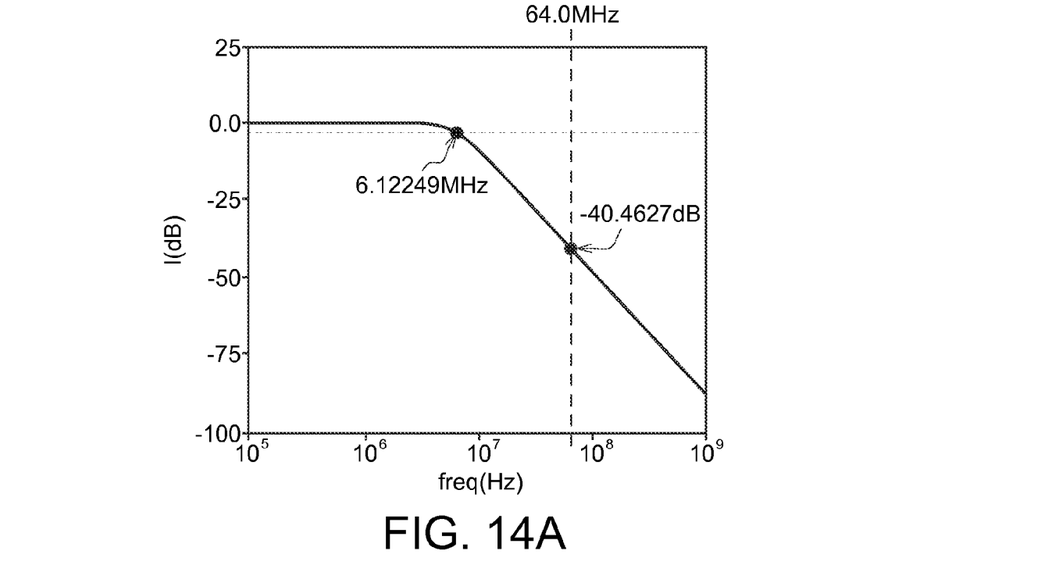
FIG. 14A illustrates a simulated frequency response of a Butterworth filter implemented by the proposed frequency selective circuit.
Figure 14B:
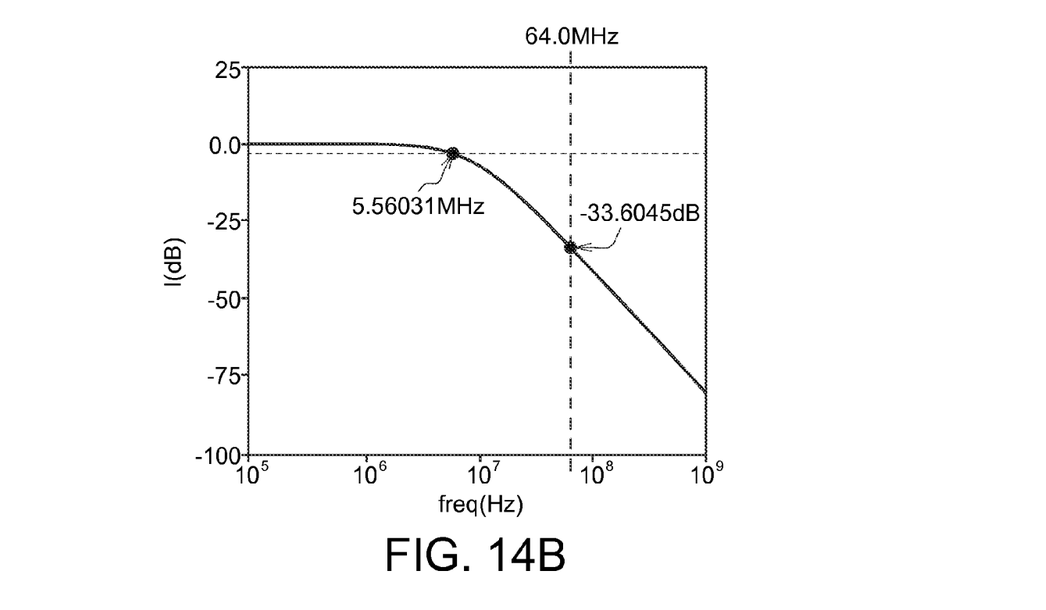
FIG. 14B illustrates a simulated frequency response of a low pass filter implemented by the frequency selective circuit shown in FIG. 13.

FIG. 14A illustrates a simulated frequency response of a Butterworth filter implemented by the proposed frequency selective circuit. FIG. 14B illustrates a simulated frequency response of a low pass filter implemented by the frequency selective circuit shown in FIG. 13. As can be seen from these figures, the rejection at 64 MHz of the proposed frequency selective circuit is at least 7 dB better than that of the frequency selective circuit 1300, and the in-band roll-off of the proposed frequency selective circuit is also smaller.

Figure 15:
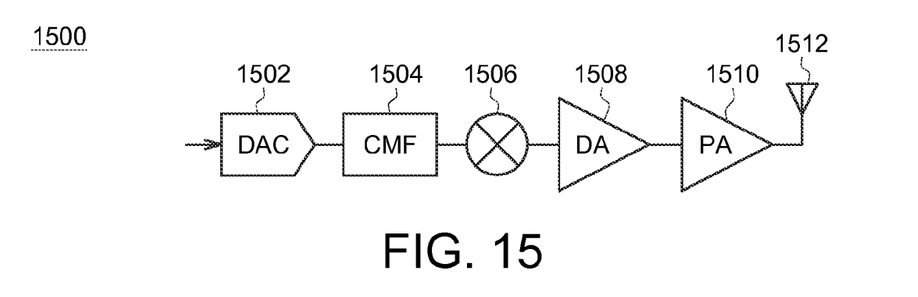
FIG. 15 shows the block diagram of a transmitter according to an embodiment of the present invention.

The proposed frequency selective circuit can be used in various electronic devices. FIG. 15 shows the block diagram of a transmitter (TX) 1500 according to an embodiment of the present invention. The TX 1500 includes a digital-to-analog converter (DAC) 1502, a current mode filter (CMF) 1504, an inphase/quadrature modulator (IQM) 1506, a driving amplifier (DA) 1508 and a power amplifier (PA) 1510 and an antenna 1512. The CMF 1504 can be implemented by any of the proposed frequency selective circuits and is used as a TX baseband filter. With the help of the proposed frequency selective circuit, high Q filtering without any extra current consumption can be achieved.

Figure 16:
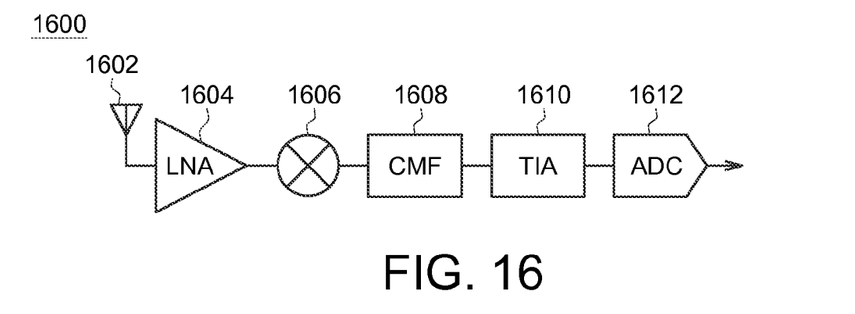
FIG. 16 shows the block diagram of a receiver according to an embodiment of the present invention.

FIG. 16 shows the block diagram of a receiver (RX) 1600 according to an embodiment of the present invention. The RX 1600 includes an antenna 1602, a low noise amplifier (LNA) 1604, a mixer 1606, a CMF 1610, a transimpedance amplifier (TIA) 1610 and an analog-to-digital converter 1612. The CMF 1608 can be implemented by any of the frequency selective circuits described above and is used as a RX baseband filter.

In conventional passive-mixer based RX, the current-mode signal needs to be transferred to voltage domain by the TIA. In the embodiment, the CMF 1610 is placed before the TIA 1610, which relaxes the TIA design and improves the current consumption.

Figure 17:
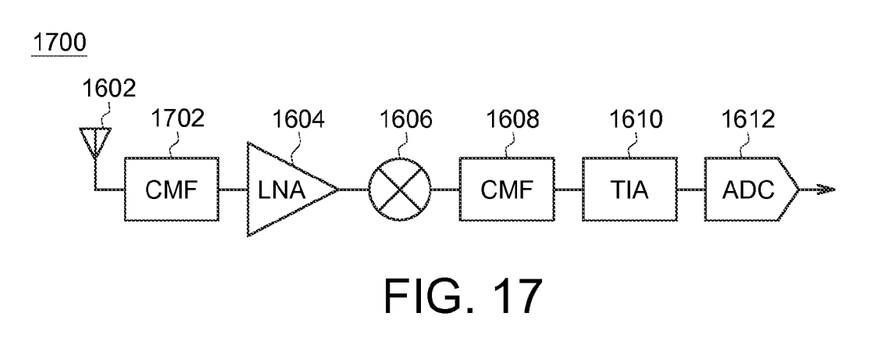
FIG. 17 shows the block diagram of a receiver according to an alternative embodiment of the present invention.

FIG. 17 shows the block diagram of a RX 1700 according to an embodiment of the present invention. The RX 1700 further includes a CMF 1702 cooperating with the LNA 1604. The CMF 1702 can be implemented by any of the proposed frequency selective circuits described above, and is used as a radio frequency (RF) filter based on the naturally wideband characteristic from current mode. In one embodiment, the CMF 1702 can be embedded into the LNA 1604 and co-designed together.

Based on the above, the present invention provides a frequency selective circuit which mainly includes a first transistor, an impedance element, a first capacitive element, a second capacitive element and a second transistor. The first transistor includes a first terminal (e.g., the drain/source), a second terminal (e.g., the source/drain) and a control terminal (e.g., the gate). The impedance element is coupled between the first terminal and the control terminal of the first transistor. The first capacitive element is coupled to the first terminal of the first transistor. The second capacitive element is coupled to the control terminal of the first transistor. The second transistor includes a first terminal, a second terminal and a control terminal coupled to the control terminal of the first transistor.

Due to the circuit configuration, the proposed frequency selective circuit exhibits excellent close-in rejections and noise performance. Further, the in-band roll-off of the proposed frequency can be much better than conventional cascaded RC LPF. In addition, the proposed frequency selective circuit needs not consume additional current, which is favored in low power design for portable design.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A frequency selective circuit, comprising:
a first transistor comprising a first terminal, a second terminal and a control terminal;
an impedance element coupled between the first terminal and the control terminal of the first transistor;
a first capacitive element coupled to the first terminal of the first transistor;
a second capacitive element coupled to the control terminal of the first transistor; and
a second transistor comprising a first terminal, a second terminal and a control terminal, the control terminal of the second transistor being coupled to the control terminal of the first transistor;
wherein the impedance element comprises a resistive element and an inductive element.

2. The frequency selective circuit according to claim 1, wherein the impedance element comprises a third transistor including a first terminal, a second terminal and a control terminal, the first terminal of the third transistor is coupled to the control terminal of the first transistor, the second terminal of the third transistor is coupled to the first terminal of the first transistor, and the control terminal is biased by a reference voltage.

3. The frequency selective circuit according to claim 2, wherein the first terminal of the third transistor is coupled to the control terminal of the first transistor via a resistive element.

4. The frequency selective circuit according to claim 1, wherein the second terminal of the first transistor is coupled to a degeneration resistive element.

5. The frequency selective circuit according to claim 1, further comprising a plurality of sub-circuits cascaded between the control terminals of the first transistor and the second transistor.

6. The frequency selective circuit according to claim 5, wherein each of the sub-circuits comprises a RC filter.

7. A frequency selective circuit, comprising:
a first transistor comprising a first terminal, a second terminal and a control terminal;
an impedance element coupled between the first terminal and the control terminal of the first transistor;
a first capacitive element coupled to the first terminal of the first transistor;
a second capacitive element coupled to the control terminal of the first transistor; and
a second transistor comprising a first terminal, a second terminal and a control terminal, the control terminal of the second transistor being coupled to the control terminal of the first transistor;
wherein the impedance element comprises a third transistor including a first terminal, a second terminal and a control terminal, the first terminal of the third transistor is coupled to the control terminal of the first transistor, the second terminal of the third transistor is coupled to the first terminal of the first transistor, and the control terminal is biased by a reference voltage;
wherein the first terminal of the third transistor is coupled to the control terminal of the first transistor via a resistive element;
wherein the impedance element further comprises an operational amplifier including a first input, a second input and an output, the first input is coupled to the reference voltage, the second input is coupled to the second terminal of the third transistor, and the output of the operational amplifier is coupled to the control terminal of the third transistor.

8. A frequency selective circuit, comprising:
a first transistor comprising a first terminal, a second terminal and a control terminal;
an impedance element coupled between the first terminal and the control terminal of the first transistor;
a first capacitive element coupled to the first terminal of the first transistor;
a second capacitive element coupled to the control terminal of the first transistor; and
a second transistor comprising a first terminal, a second terminal and a control terminal, the control terminal of the second transistor being coupled to the control terminal of the first transistor;
wherein the impedance element comprises:
a first complementary transistor including a first terminal, a second terminal and a control terminal, wherein the first terminal of the first complementary transistor is coupled to the first terminal of the first transistor, the control terminal of the first complementary transistor is coupled to the control terminal of the first transistor, and the type of the first complementary transistor is complementary to that of the first transistor; and
a resistive element coupled between the first terminal and the control terminal of the first complementary transistor.

9. The frequency selective circuit according to claim 8, further comprises:
a second complementary transistor coupled to the second transistor and forming a CMOS inverter together with the second transistor.

10. A frequency selective circuit, comprising:
a first transistor comprising a first terminal, a second terminal and a control terminal;
an impedance element coupled between the first terminal and the control terminal of the first transistor;
a first capacitive element coupled to the first terminal of the first transistor;
a second capacitive element coupled to the control terminal of the first transistor; and
a second transistor comprising a first terminal, a second terminal and a control terminal, the control terminal of the second transistor being coupled to the control terminal of the first transistor;
wherein the first transistor, the impedance element and the second capacitive element form one branch of an input differential pair in an input stage of the frequency selective circuit, and the branch of the input differential pair is coupled to another branch of the input differential pair via the first capacitive element.

11. The frequency selective circuit according to claim 10, wherein the second transistor forms one branch of an output differential pair in an output stage of the frequency selective circuit, and the branch of the output differential pair is coupled to another branch of the output differential pair via the second terminal of the second transistor.

12. The frequency selective circuit according to claim 11, wherein the branch of the input differential pair is coupled to the other branch of the input differential pair further via the second capacitive element.

13. The frequency selective circuit according to claim 12, wherein the second terminal of the first transistor is coupled to a degeneration element.

14. The frequency selective circuit according to claim 13, wherein the branches of the input differential pair are commonly coupled to a degeneration element at the second terminal of the first transistor.

* * * * *